(12) United States Patent
Kato

(10) Patent No.: US 9,871,281 B2
(45) Date of Patent: *Jan. 16, 2018

(54) HIGH-FREQUENCY SIGNAL LINE

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/587,770

(22) Filed: May 5, 2017

(65) Prior Publication Data
US 2017/0244145 A1  Aug. 24, 2017

Related U.S. Application Data

(63) Continuation of application No. 14/568,341, filed on Dec. 12, 2014, now Pat. No. 9,680,195, which is a continuation of application No. PCT/JP2013/074651, filed on Sep. 12, 2013.

(30) Foreign Application Priority Data

Oct. 12, 2012 (JP) ................................. 2012-226566

(51) Int. Cl.
| | |
|---|---|
| *H01P 3/08* | (2006.01) |
| *H05K 1/02* | (2006.01) |
| *H05K 1/11* | (2006.01) |

(52) U.S. Cl.
CPC .............. *H01P 3/082* (2013.01); *H01P 3/085* (2013.01); *H05K 1/0242* (2013.01); *H05K 1/115* (2013.01)

(58) Field of Classification Search
CPC .. H01P 3/08; H01P 3/081; H01P 3/082; H01P 3/085; H01P 3/087; H01P 3/088
USPC .......................................... 333/238, 246, 33
See application file for complete search history.

(56) References Cited

U.S. PATENT DOCUMENTS 9,608,304 B2 * 3/2017 Yosui ....................... H01P 3/085
9,680,195 B2 * 6/2017 Kato ........................ H01P 3/082

OTHER PUBLICATIONS

Kato, "High-Frequency Signal Line", U.S. Appl. No. 14/568,341, filed Dec. 12, 2014.

* cited by examiner

*Primary Examiner* — Stephen E Jones
(74) *Attorney, Agent, or Firm* — Keating & Bennett, LLP

(57) ABSTRACT

A high-frequency signal line includes a dielectric body including a first dielectric layer and one or more other dielectric layers laminated together. A first signal line is provided on a first main surface, which is a main surface located on one side in a direction of lamination, of the first dielectric layer. A second signal line is provided on a second main surface, which is a main surface located on another side in the lamination direction, of the first dielectric layer so as to face the first signal line via the first dielectric layer. The second signal line is electrically connected to the first signal line. A first ground conductor is located on one side in the lamination direction than the first signal line. A second ground conductor is located on another side in the lamination direction than the second signal line.

4 Claims, 13 Drawing Sheets

F I G. 4
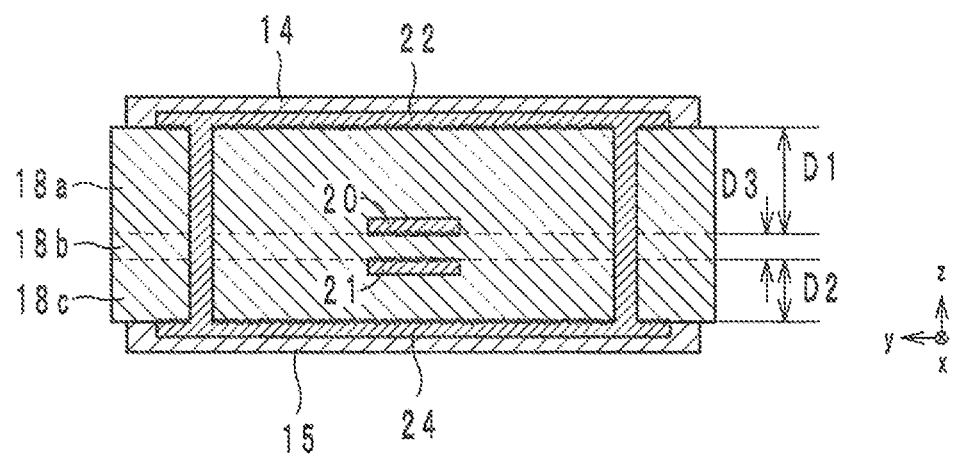
F I G. 5
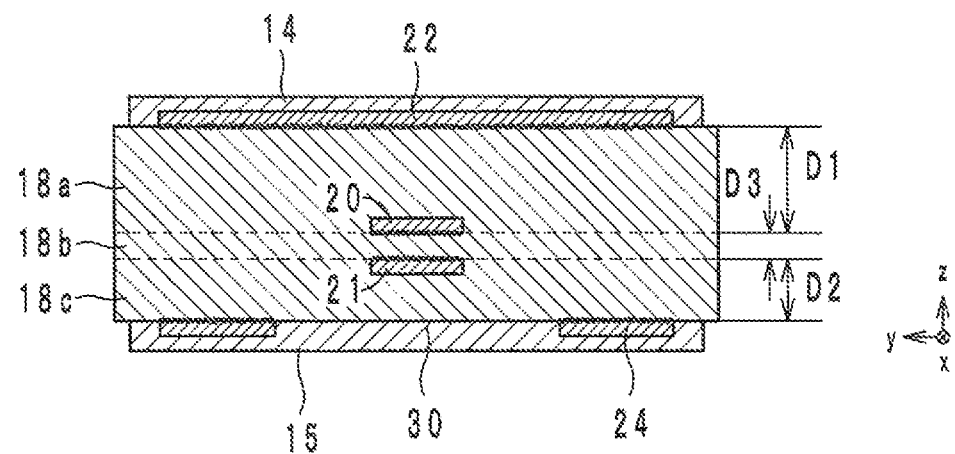

F I G . 15
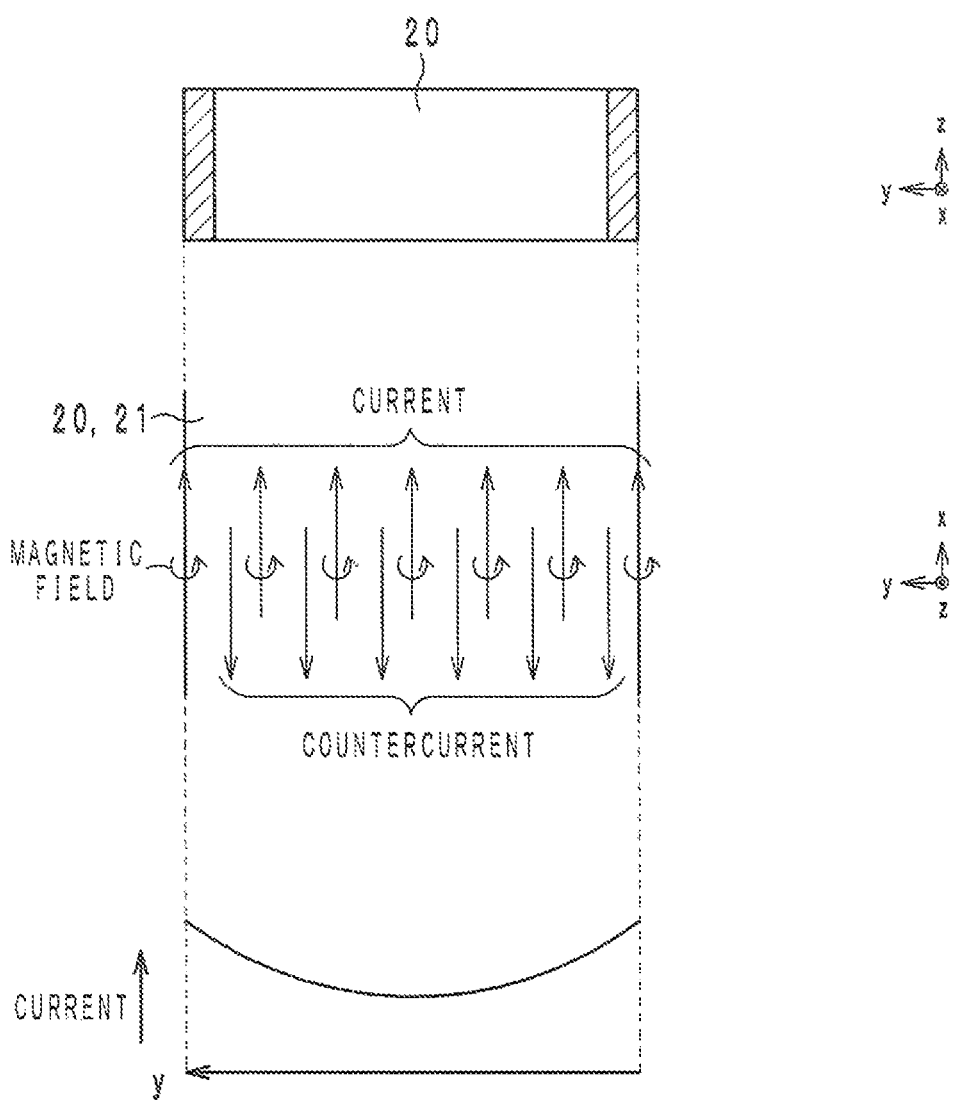

HIGH-FREQUENCY SIGNAL LINE

BACKGROUND OF THE INVENTION

1. Field of the Invention

The present invention relates to a high-frequency signal line, and more particularly to a high-frequency signal line preferably for use in high-frequency signal transmission.

2. Description of the Related Art

As a conventional high-frequency signal line, for example, a signal line disclosed in WO2011/007660 is known. The signal line includes a laminate body, a linear signal line and two ground conductors. The laminate body is a laminate of insulating sheets. The linear signal line is provided in the laminate body. The two ground conductors are provided in the laminate body so as to sandwich the linear signal line in the direction of lamination. Accordingly, the linear signal line and the two ground conductors form a triplate-type stripline structure.

Each of the ground conductors has a plurality of openings at positions over the linear signal line when viewed from the direction of lamination. As a result, little capacitance is created between the linear signal line and each of the ground conductors. Therefore, it is possible to reduce the distance in the direction of lamination between the linear signal line and each of the ground conductors, and it is possible to make the signal line thinner. This signal line is used, for example, to connect two circuit boards.

The signal line disclosed in WO2011/007660 has a risk that an attempt to reduce the insertion loss results in breakage of the insulating sheets at the time of manufacture. More specifically, in order to reduce the insertion loss of the signal line, the thickness of the linear signal line shall be increased so that the cross-section area of the linear signal line can be enlarged.

However, the thicker the linear signal line, the more time it takes to complete an etching step for processing a conductive layer into a linear signal line. The etching step is carried out as follows: while each insulating sheet with a conductive layer formed entirely thereon is sent, an etching solution is sprayed on the conductive layer. After the etching step, a pressure-bonding step is carried out as follows: the insulating sheets are pressure-bonded together while the insulating sheets are sent. Accordingly, a reduction in the processing speed at the etching step causes a reduction in the processing speed at the pressure-bonding step, and consequently, the time it takes to manufacture the signal line is increased.

In order to improve the processing speed in the etching step, it is possible that a more acidic etching solution is used. However, the use of a more acidic etching solution may cause damage to the insulating sheets.

SUMMARY OF THE INVENTION

Preferred embodiments of the present invention provide a high-frequency signal line that prevents damage to dielectric layers while reducing insertion loss.

A high-frequency signal line according to a preferred embodiment of the present invention includes a dielectric body including a first dielectric layer and one or more other dielectric layers laminated together; a first signal line provided on a first main surface of the first dielectric layer, the first main surface being a main surface of the first dielectric layer located on one side in a lamination direction; a second signal line provided on a second main surface of the first dielectric layer so as to face the first signal line via the first dielectric layer, the second main surface being a main surface of the first dielectric layer located on another side in the lamination direction, and the second signal line being electrically connected to the first signal line; a first ground conductor located on the one side in the lamination direction than the first signal line; and a second ground conductor located on another side in the lamination direction than the second signal line.

According to various preferred embodiments of the present invention, it is possible to prevent damage to dielectric layers while reducing the insertion loss.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a sectional view of the high-frequency signal line along the line A-A indicated in FIG. 3.

FIG. 5 is a sectional view of the high-frequency signal line along the line B-B indicated in FIG. 3.

FIG. 15 indicates a sectional view and a plan view of a non-curved signal line, and a chart indicating current distribution.

DETAILED DESCRIPTION OF THE PREFERRED EMBODIMENTS

High-frequency signal lines according to some preferred embodiments of the present invention are hereinafter described with reference to the drawings.

First Preferred Embodiment

Figure 1:
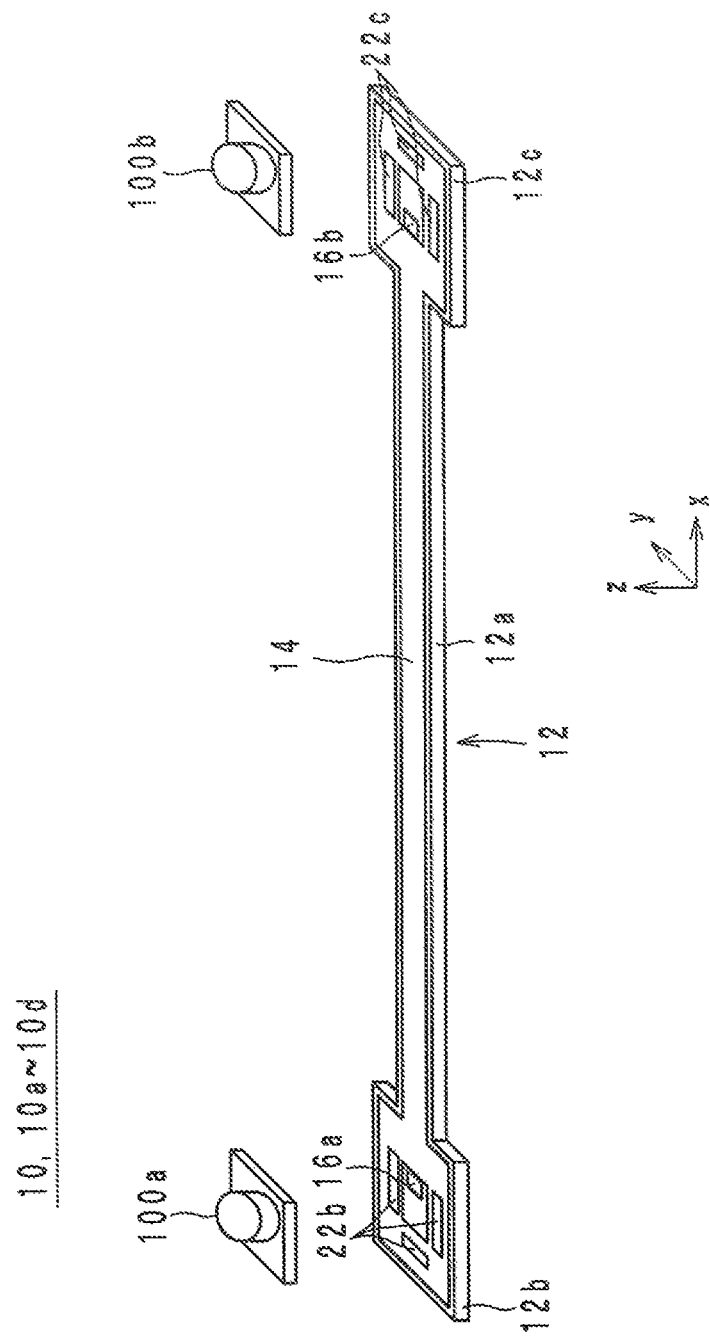
FIG. 1 is a perspective view of a high-frequency signal line according to a first preferred embodiment of the present invention.
Figure 2:
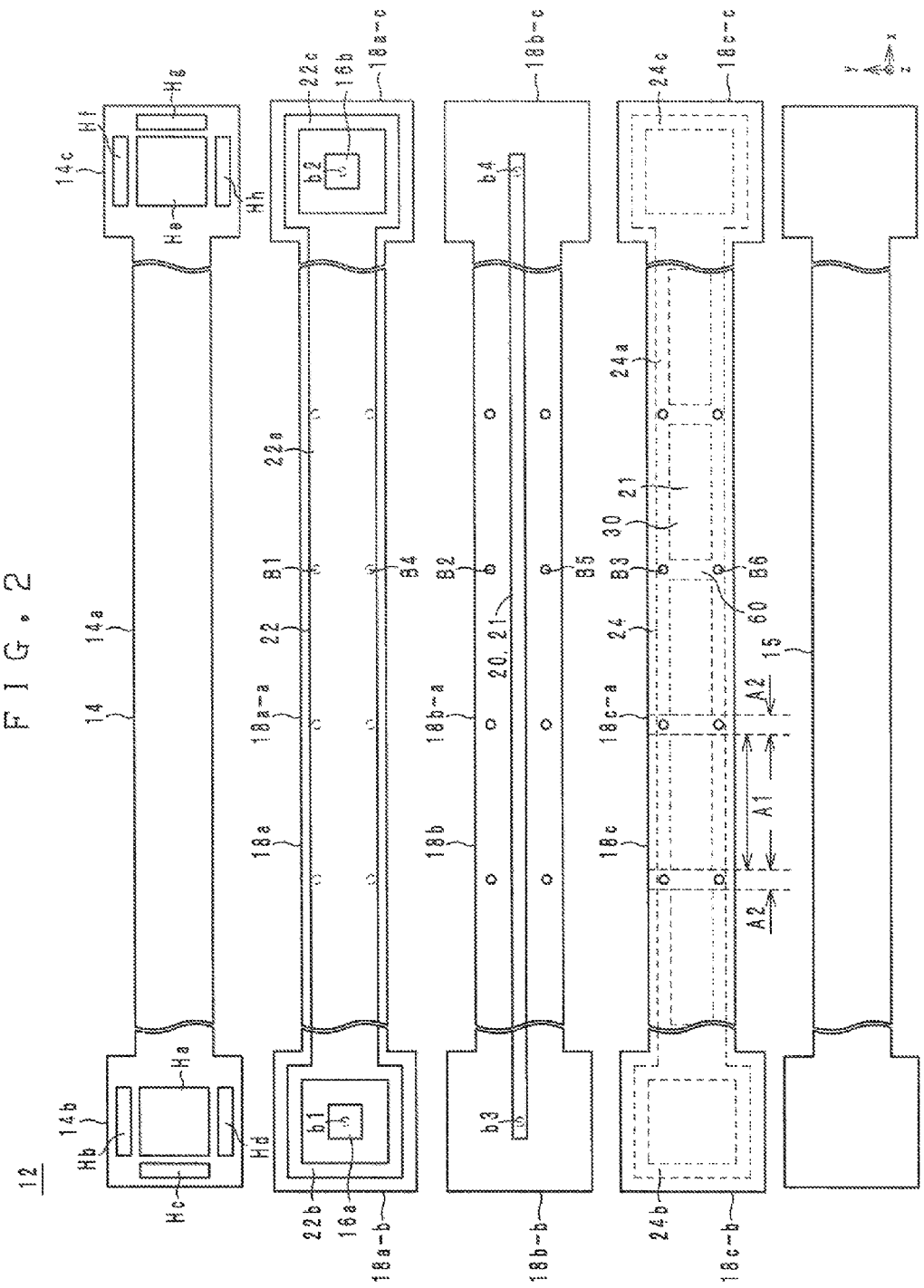
FIG. 2 is an exploded view of a dielectric body of the high-frequency signal line illustrated in FIG. 1.
Figure 3:
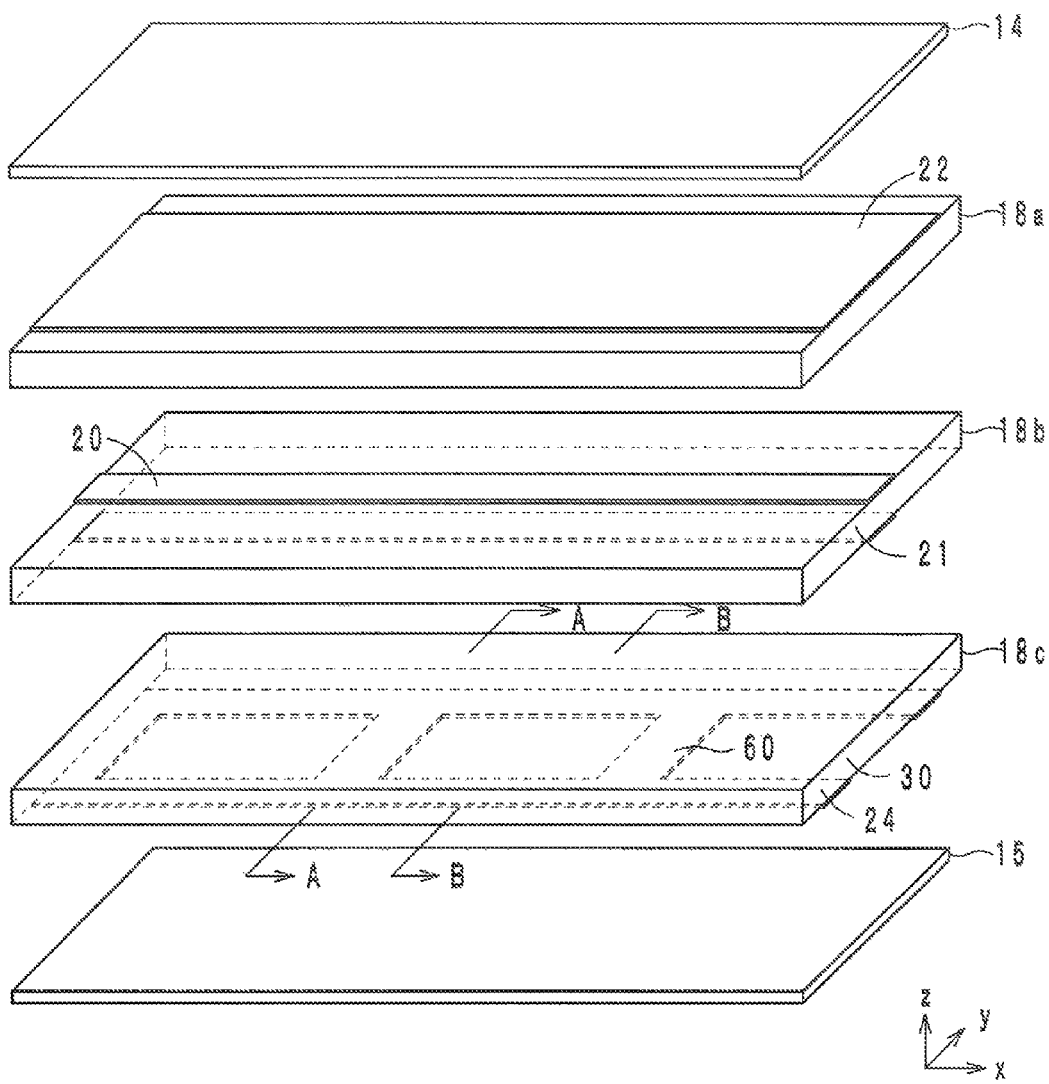
FIG. 3 is an exploded perspective view of a line portion of the high-frequency signal line.

The structure of a high-frequency signal line 10 according to a first preferred embodiment of the present invention is described with reference to the drawings. FIG. 1 is a perspective view of the high-frequency signal line 10 according to the first preferred embodiment. FIG. 2 is an exploded view of a dielectric body 12 of the high-frequency signal line 10. FIG. 3 is an exploded perspective view of a line portion 12a of the high-frequency signal line 10. FIG. 4 is a sectional view of the high-frequency signal line 10 along the line A-A indicated in FIG. 3. FIG. 5 is a sectional view of the high-frequency signal line 10 along the line B-B indicated in FIG. 3. In the following, the direction of lamination of the high-frequency signal line 10 is defined as a z-direction. The lengthwise direction of the high-frequency signal line 10 is defined as an x-direction, and the direction orthogonal to the x-direction and the z-direction is defined as a y-direction.

The high-frequency signal line 10 is preferably used, for example, in an electronic device, such as a cellphone, to connect two high-frequency circuits to each other. As seen in FIGS. 1 through 3, the high-frequency signal line 10 preferably includes a dielectric body 12, external terminals 16a and 16b, signal line 20 and 21, a main ground conductor 22, and auxiliary ground conductor 24, via-hole conductors b1 through b4 and B1 through B6, and connectors 100a and 100b.

The dielectric body 12 is, as illustrated in FIG. 1, a flexible plate-shaped member extending in the x-direction when viewed from the z-direction. The dielectric body 12 includes a line portion 12a, and connecting portions 12b and 12c. As illustrated in FIG. 2, the dielectric body 12 is a laminate of a protective layer 14, dielectric sheets 18a through 18c and a protective layer 15 laminated in this order from a positive side to a negative side in the z-direction. A main surface of the dielectric body 12 on the positive side in the z-direction is hereinafter referred to as a top surface, and a main surface of the dielectric body 12 on the negative side in the z-direction is hereinafter referred to as a bottom surface.

As seen in FIG. 1, the line portion 12a extends in the x-direction. The connecting portion 12b is a rectangular or substantially rectangular portion connected to a negative end in the x-direction of the line portion 12a, and the connecting portion 12c is a rectangular or substantially rectangular portion connected to a positive end in the x-direction of the line portion 12a. The widths (sizes in the y-direction) of the connecting portions 12b and 12c are greater than the width (size in the y-direction) of the line portion 12a.

The dielectric sheets 18a through 18c, as seen in FIG. 2, extend in the x-direction and have the same shape as the dielectric body 12 when viewed from the z-direction. The dielectric sheets 18a through 18c are preferably formed of flexible thermoplastic resin such as polyimide, liquid polymer or the like. A main surface of each of the dielectric sheets 18a through 18c on the positive side in the z-direction is hereinafter referred to as an upper surface, and a main surface of each of the dielectric sheets 18a through 18c on the negative side in the z-direction is hereinafter referred to as a lower surface.

As illustrated in FIGS. 4 and 5, the thickness D1 of the dielectric sheet 18a is greater than the thickness D2 of the dielectric sheet 18c. After a process of laminating the dielectric sheets 18a through 18c, the thickness D1 preferably is, for example, within a range from about 50 μm to about 300 μm. In this preferred embodiment, the thickness D1 preferably is about 150 μm, for example. The thickness D2 preferably is, for example, within a range from about 10 μm to about 100 μm. In this preferred embodiment, the thickness D2 preferably is about 50 μm, for example. The thickness D3 of the dielectric sheet 18b preferably is, for example, within a range from about 3 μm to about 50 μm. In this preferred embodiment, the thickness D3 preferably is about 12.5 μm, for example.

The dielectric sheet 18a, as illustrated in FIG. 2, includes a line portion 18a-a, and connecting portions 18a-b and 18a-c. The dielectric sheet 18b, as illustrated in FIG. 2, includes a line portion 18b-a, and connecting portions 18b-b and 18b-c. The dielectric sheet 18c includes a line portion 18c-a, and connecting portions 18c-b and 18c-c. The line portions 18a-a, 18b-a and 18c-a constitute the line portion 12a. The connecting portions 18a-b, 18b-b and 18c-b constitute the connecting portion 12b. The connecting portions 18a-c, 18b-c and 18c-c constitute the connecting portion 12c.

The signal line 20 is, as seen in FIGS. 2 and 3, a conductor provided in the dielectric body 12, and the signal line 20 is configured to transmit a high-frequency signal. In this preferred embodiment, the signal line 20 is a linear conductor provided on the upper surface of the dielectric sheet 18b and extends straight in the x-direction. The negative end in the x-direction of the signal line 20 is, as seen in FIG. 2, located in the center of the connecting portion 18b-b. The positive end in the x-direction of the signal line 20 is, as seen in FIG. 2, located in the center of the connecting portion 18b-c. The signal line 20 preferably is preferably formed of a metal material with a low specific resistance including silver or copper. The statement that the signal line 20 is provided on the upper surface of the dielectric sheet 18b means that the signal line 20 is preferably formed by plating the upper surface of the dielectric sheet 18b with a metal foil and by patterning the metal foil or that the signal line 20 is preferably formed by applying a metal foil on the upper surface of the dielectric sheet 18b and by patterning the metal foil. The surface of the signal line 20 is smoothened, and therefore, the surface of the signal line 20 in contact with the dielectric sheet 18b has a greater surface roughness than the surface of the signal line 20 out of contact with the dielectric sheet 18b. The surface roughness means the calculated average roughness Ra provided in JIS B 0601-2001 (compliant with ISO4287-1997), and the same shall apply hereinafter.

The signal line 21 is, as seen in FIGS. 2 and 3, a conductor provided in the dielectric body 12, and the signal line 21 is configured to transmit a high-frequency signal. In this preferred embodiment, the signal line 21 is a linear conductor provided on the lower surface of the dielectric sheet 18b and extends straight in the x-direction. The negative end in the x-direction of the signal line 21 is, as seen in FIG. 2, located in the center of the connecting portion 18b-b. The positive end in the x-direction of the signal line 21 is, as seen in FIG. 2, located in the center of the connecting portion 18b-c. The signal line 21 is preferably formed of a metal material with a low specific resistance including silver or copper. The statement that the signal line 21 is provided on the lower surface of the dielectric sheet 18b means that the signal line 21 is preferably formed by plating the lower surface of the dielectric sheet 18b with a metal foil and by patterning the metal foil or that the signal line 21 is preferably formed by applying a metal foil on the lower surface of the dielectric sheet 18b and by patterning the metal foil. The surface of the signal line 21 is smoothened, and therefore, the surface of the signal line 21 in contact with the dielectric sheet 18b (upper surface of the signal line 21) has a greater surface roughness than the surface of the signal line 21 out of contact with the dielectric sheet 18b (lower surface of the signal line 21).

As seen in FIG. 5, the signal line 20 and the signal line 21 face each other via the dielectric sheet 18b. In this preferred embodiment, the signal lines 20 and 21 have the same shape and are located on the same position when viewed from the z-direction. The signal lines 20 and 21 do not need to be completely identical to each other and do not need to be located on quite the same position when viewed from the z-direction. However, in order to permit the signal lines 20 and 21 to define and function substantially as one signal line, it is preferred that the signal lines 20 and 21 have substantially the same shape and substantially overlap each other.

The main ground conductor 22 is, as seen in FIG. 2, a continuous conductor layer located farther in the positive z-direction than the signal line 20. More specifically, the main ground conductor 22 is arranged on the upper surface of the dielectric sheet 18a so as to face the signal line 20 via the dielectric sheet 18a. The main ground conductor 22 does not have openings at positions over the signal line 20. The main ground conductor 22 is preferably formed of a metal material with a low specific resistance including silver or copper. The statement that the main ground conductor 22 is provided on the upper surface of the dielectric sheet 18a means that the main ground conductor is preferably formed by plating the upper surface of the dielectric sheet 18a with a metal foil and by patterning the metal foil or that the main ground conductor 22 is preferably formed by applying a metal foil on the upper surface of the dielectric sheet 18a and by patterning the metal foil. The surface of the main ground conductor 22 is smoothened, and therefore, the surface of the main ground conductor 22 in contact with the dielectric layer 18a has a greater surface roughness than the surface of the main ground conductor 22 out of contact with the dielectric layer 18a.

The main ground conductor 22, as illustrated in FIG. 2, includes a line portion 22a, and terminal portions 22b and 22c. The line portion 22a is provided on the upper surface of the line portion 18a-a to extend in the x-direction. The terminal portion 22b is provided on the upper surface of the connecting portion 18a-b and is rectangular or substantially rectangular ring-shaped. The terminal portion 22b is connected to the negative end in the x-direction of the line portion 22a. The terminal portion 22c is provided on the upper surface of the connecting portion 18a-c and is rectangular or substantially rectangular ring-shaped. The terminal portion 22c is connected to the positive end in the x-direction of the line portion 22a.

The auxiliary ground conductor 24 is, as seen in FIG. 2, a conductor layer located farther in the negative z-direction than the signal line 21. More specifically, the auxiliary ground conductor 24 is provided on the lower surface of the dielectric sheet 18c so as to face the signal line 21 via the dielectric sheet 18c. The auxiliary ground conductor 24 is preferably formed of a metal material with a low specific resistance including silver or copper. The statement that the auxiliary ground conductor 24 is provided on the lower surface of the dielectric sheet 18c means that the auxiliary ground conductor 24 is preferably formed by plating the lower surface of the dielectric sheet 18c with a metal foil and by patterning the metal foil or that the auxiliary ground conductor 24 is preferably formed by applying a metal foil on the lower surface of the dielectric sheet 18c and by patterning the metal foil. The surface of the auxiliary ground conductor 24 is smoothened. Therefore, as indicated in FIGS. 4 and 5, the surface of the auxiliary ground conductor 24 in contact with the dielectric layer 18c has a greater surface roughness than the surface of the auxiliary ground conductor 24 out of contact with the dielectric layer 18c.

The auxiliary ground conductor 24, as illustrated in FIG. 2, includes a line portion 24a, and terminal portions 24b and 24c. The line portion 24a is provided on the lower surface of the line portion 18c-a to extend in the x-direction. The terminal portion 24b is provided on the lower surface of the connecting portion 18c-b and is rectangular or substantially rectangular ring-shaped. The terminal portion 24b is connected to the negative end in the x-direction of the line portion 24a. The terminal portion 24c is provided on the lower surface of the connecting portion 18c-c and is rectangular or substantially rectangular ring-shaped. The terminal portion 24c is connected to the positive end in the x-direction of the line portion 24a.

As seen in FIGS. 2 and 3, the line portion 24a includes rectangular or substantially rectangular openings 30 aligned in the x-direction. Accordingly, the line portion 24a preferably has a ladder-shaped configuration. In the auxiliary ground conductor 24, intervals between the openings 30 are referred to as bridges 60. Each of the bridges 60 extends in the y-direction. When viewed from the z-direction, the openings 30 and the bridges 60 are alternately arranged to be overlapped with the signal line 20. In this preferred embodiment, the signal line 20 extends in the x-direction while crossing the centers of the openings 30 and the bridges 60.

As seen in FIG. 2, the external terminal 16a is a rectangular or substantially rectangular conductor provided in the center of the upper surface of the connecting portion 18a-b of the dielectric sheet 18a. Therefore, when viewed from the z-direction, the external terminal 16a is over the respective negative ends in the x-direction of the signal lines 20 and 21. As seen in FIG. 2, the external terminal 16b is a rectangular or substantially rectangular conductor provided in the center of the upper surface of the connecting portion 18a-c of the dielectric sheet 18a. Therefore, when viewed from the z-direction, the external terminal 16b is over the respective positive ends in the x-direction of the signal lines 20 and 21. The external terminals 16a and 16b are preferably formed of a metal material with a low specific resistance including silver or copper. The external terminals 16a and 16b preferably are plated with Ni/Au. The statement that the external terminals 16a and 16b are provided on the upper surface of the dielectric sheet 18a means that the external terminals 16a and 16b are preferably formed by plating the upper surface of the dielectric sheet 18a with a metal foil and by patterning the metal foil or that the external terminals 16a and 16b are preferably formed by applying a metal foil on the upper surface of the dielectric sheet 18a and by patterning the metal foil. The surfaces of the external terminals 16a and 16b are smoothened, and therefore, the respective surfaces of the external terminals 16a and 16b in contact with the dielectric layer 18a have a greater surface roughness than the respective surfaces of the external terminals 16a and 16b out of contact with the dielectric layer 18a.

The external terminals 16a and 16b, the signal lines 20 and 21, the main ground conductor 22 and the auxiliary ground conductor 24 preferably have a same or substantially same thickness. The thickness of the external terminals 16a and 16b, the signal lines 20 and 21, the main ground conductor 22 and the auxiliary ground conductor 24 preferably are, for example, within a range from about 10 μm to about 20 μm.

As described above, the signal lines 20 and 21 are sandwiched between the main ground conductor 22 and the auxiliary ground conductor 24 from both sides in the z-direction. Thus, the signal lines 20 and 21, the main ground conductor 22 and the auxiliary ground conductor 24 define a triplate stripline structure. As illustrated in FIGS. 4 and 5, the interval (distance in the z-direction) between the signal line 20 and the main ground conductor 22 is equal or substantially equal to the thickness D1 of the dielectric sheet 18a, and preferably is, for example, within a range from about 50 μm to about 300 μm. In this preferred embodiment, the interval between the signal line 20 and the main ground conductor 22 preferably is about 150 μm, for example. The interval (distance in the z-direction) between the signal line 21 and the auxiliary ground conductor 24 is equal or substantially equal to the thickness D2 of the dielectric sheet 18c, and preferably is, for example, within a range from about 10 μm to about 100 μm. In this preferred embodiment, the interval between the signal line 21 and the auxiliary ground conductor 24 preferably is about 50 μm, for example. Thus, the distance in the z-direction between the signal line 20 and the main ground conductor 22 is greater than the distance in the z-direction between the signal line 21 and the auxiliary ground conductor 24.

The via-hole conductors B1 are, as seen in FIG. 2, pierced in the dielectric sheet 18a in the z-direction. The via-hole conductors B1 are located farther in the positive y-direction than the signal lines 20 and 21, and are aligned in the x-direction at uniform intervals. The via-hole conductors B2 are, as seen in FIG. 2, pierced in the dielectric sheet 18b in the z-direction. The via-hole conductors B2 are located farther in the positive y-direction than the signal lines 20 and 21, and are aligned in the x-direction at uniform intervals. The via-hole conductors B3 are, as seen in FIG. 2, pierced in the dielectric sheet 18c in the z-direction. The via-hole conductors B3 are located farther in the positive y-direction than the signal lines 20 and 21, and are aligned in the x-direction at uniform intervals. The via-hole conductors B1 are connected to the respectively adjacent via-hole conductors B2, and the via-hole conductors B2 are connected to the respectively adjacent via-hole conductors B3. Accordingly, each connected set of via-hole conductors B1 through B3 defines and serves as one via-hole conductor. The respective positive ends in the z-direction of the via-hole conductors B1 are connected to the main ground conductor 22. The respective negative ends in the z-direction of the via-hole conductors B3 are connected to the auxiliary ground conductor 24, and more specifically to the respective positive sides in the y-direction of the bridges 60. The via-hole conductors B1 through B3 are preferably formed by filling via holes made in the dielectric sheets 18a through 18c with conductive paste including silver, tin, copper or the like and by solidifying the conductive paste.

The via-hole conductors B4 are, as seen in FIG. 2, pierced in the dielectric sheet 18a in the z-direction. The via-hole conductors B4 are located farther in the negative y-direction than the signal lines 20 and 21, and are aligned in the x-direction at uniform intervals. The via-hole conductors B5 are, as seen in FIG. 2, pierced in the dielectric sheet 18b in the z-direction. The via-hole conductors B5 are located farther in the negative y-direction than the signal lines 20 and 21, and are aligned in the x-direction at uniform intervals. The via-hole conductors B6 are, as seen in FIG. 2, pierced in the dielectric sheet 18c in the z-direction. The via-hole conductors B6 are located farther in the negative y-direction than the signal lines 20 and 21, and are aligned in the x-direction at uniform intervals. The via-hole conductors B4 are connected to the respectively adjacent via-hole conductors B5, and the via-hole conductors B5 are connected to the respectively adjacent via-hole conductors B6. Accordingly, each connected set of via-hole conductors B4 through B6 defines and serves as one via-hole conductor. The respective positive ends in the z-direction of the via-hole conductors B4 are connected to the main ground conductor 22. The respective negative ends in the z-direction of the via-hole conductors B6 are connected to the auxiliary ground conductor 24, and more specifically to the respective negative sides in the y-direction of the bridges 60. The via-hole conductors B4 through B6 are preferably formed by filling via holes made in the dielectric sheets 18a through 18c with conductive paste including silver, tin, copper or the like and by solidifying the conductive paste.

The via-hole conductor b1, as seen in FIG. 2, is pierced in the dielectric sheet 18a in the z-direction so as to connect the external terminal 16a to the negative end in the x-direction of the signal line 20. The via-hole conductor b3, as seen in FIG. 2, is pierced in the dielectric sheet 18b in the z-direction so as to connect the negative end in the x-direction of the signal line 20 to the negative end in the x-direction of the signal line 21. The via-hole conductor b2, as seen in FIG. 2, is pierced in the dielectric sheet 18a in the z-direction so as to connect the external terminal 16b to the positive end in the x-direction of the signal line 20. The via-hole conductor b4, as seen in FIG. 2, is pierced in the dielectric sheet 18b in the z-direction so as to connect the positive end in the x-direction of the signal line 20 to the positive end in the x-direction of the signal line 21. Accordingly, the signal lines 20 and 21 are connected between the external terminal 16a and 16b, and the signal line 20 and the signal line 21 are electrically connected to each other. The via-hole conductors b1 through b4 are preferably formed by filling via holes made in the dielectric sheets 18a and 18b with conductive paste including silver, tin, copper or the like and by solidifying the conductive paste.

The protective layer 14 is an insulating layer covering substantially the entire upper surface of the dielectric sheet 18a. Accordingly, the protective layer 14 covers the main ground conductor 22. The protective layer 14 is preferably formed of, for example, flexible resin such as a resist material.

The protective layer 14, as illustrated in FIG. 2, includes a line portion 14a, and connecting portions 14b and 14c. The line portion 14a covers substantially the entire upper surface of the line portion 18a-a and accordingly covers the line portion 22a of the main ground conductor 22.

The connecting portion 14b is connected to the negative end in the x-direction of the line portion 14a and covers the upper surface of the connecting portion 18a-b. However, the connecting portion 14b includes openings Ha through Hd. The opening Ha is a rectangular or substantially rectangular opening made in the center of the connecting portion 14b. The external terminal 16a is exposed to outside through the opening Ha. The opening Hb is a rectangular or substantially rectangular opening located farther in the positive y-direction than the opening Ha. The opening Hc is a rectangular or substantially rectangular opening located farther in the negative x-direction than the opening Ha. The opening Hd is a rectangular or substantially rectangular opening located farther in the negative y-direction than the opening Ha. The terminal portion 22b is exposed to outside through the openings Hb through Hd and defines and functions as an external terminal.

The connecting portion 14c is connected to the positive end in the x-direction of the line portion 14a and covers the upper surface of the connecting portion 18a-c. However, the connecting portion 14c includes openings He through Hh. The opening He is a rectangular or substantially rectangular opening made in the center of the connecting portion 14c. The external terminal 16b is exposed to outside through the opening He. The opening Hf is a rectangular or substantially rectangular opening located farther in the positive y-direction than the opening He. The opening Hg is a rectangular or substantially rectangular opening located farther in the positive x-direction than the opening He. The opening Hh is a rectangular or substantially rectangular opening located farther in the negative y-direction than the opening He. The terminal portion 22c is exposed to outside through the openings Hf through Hh and defines and functions as an external terminal.

The protective layer 15 is an insulating layer covering substantially the entire lower surface of the dielectric sheet 18c. Accordingly, the protective layer 15 covers the auxiliary ground conductor 24. The protective layer 15 is preferably formed of, for example, flexible resin such as a resist material.

In the high-frequency signal line 10 having the structure described above, the characteristic impedance of the signal lines 20 and 21 changes cyclically between an impedance value Z1 and an impedance value Z2. More specifically, in areas A1 where the signal lines 20 and 21 are over the openings 30, relatively small capacitance is created between the signal lines 20 and 21, and the auxiliary ground conductor 24. Accordingly, the characteristic impedance of the signal lines 20 and 21 in the areas A1 is a relatively high value Z1.

In areas A2 where the signal lines 20 extend over the bridges 60, on the other hand, a relatively large capacitance is created between the signal lines 20 and 21, and the auxiliary ground conductor 24. Accordingly, the characteristic impedance of the signal lines 20 and 21 in the areas A2 is a relatively low value Z2. In this regard, the areas A1 and the areas A2 are arranged alternately in the x-direction, and therefore, the characteristic impedance of the signal lines 20 and 21 changes cyclically between the value Z1 and the value Z2. The impedance value Z1 is, for example, about 55Ω, and the impedance value Z2 is, for example, about 45Ω. The average characteristic impedance of the signal lines 20 and 21 as a whole is, for example, about 50Ω.

Figure 6:
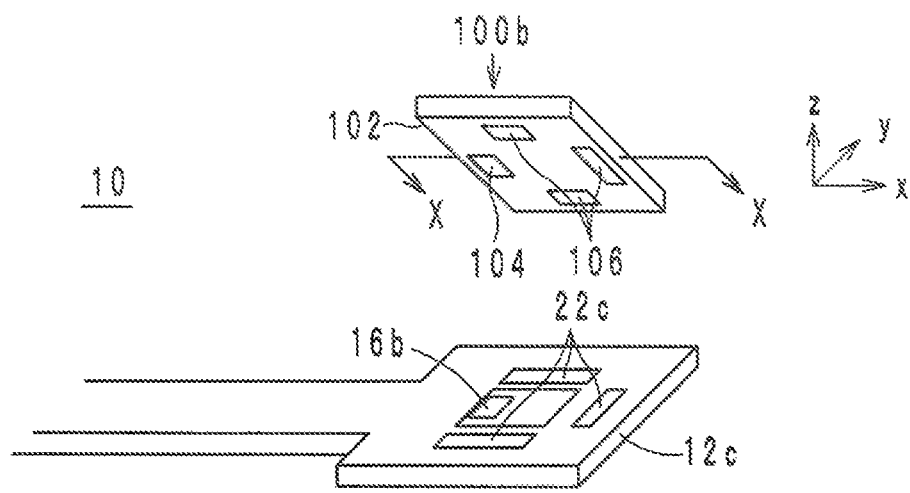
FIG. 6 is a perspective view of a connector of the high-frequency signal line.
Figure 7:
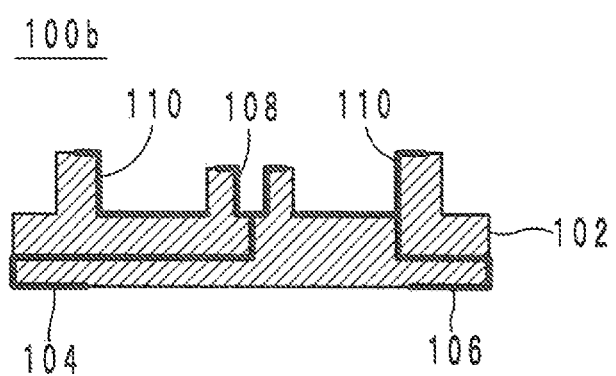
FIG. 7 is a sectional view of the connector of the high-frequency signal line.

The connectors 100a and 100b are, as illustrated in FIG. 1, mounted on the top surfaces of the connecting portions 12b and 12c, respectively. The connectors 100a and 100b preferably have the same structure, and in the following, the structure of the connector 100b is described as an example. FIG. 6 is a perspective view of the connector 100b of the high-frequency signal line 10. FIG. 7 is a sectional view of the connector 100b of the high-frequency signal line 10.

The connector 100b, as illustrated in FIGS. 1, 6 and 7, preferably includes a connector body 102, external terminals 104 and 106, a central conductor 108 and an external conductor 110. The connector body 102 preferably is in the shape of a rectangular or substantially rectangular plate with a cylinder connected thereon, and is preferably formed of an insulating material such as resin.

The external terminal 104 is provided on the surface of the plate-shaped portion of the connector body 102 on the negative side in the z-direction so as to face the external terminal 16b. The external terminal 106 is provided on the surface of the plate-shaped portion of the connector body 102 on the negative side in the z-direction so as to face the terminal conductor 22c exposed through the openings Hf through Hh.

The central conductor 108 is located in the center of the cylindrical portion of the connector body 102 and is connected to the external terminal 104. The central conductor 108 is a signal terminal at which a high-frequency signal is input or output. The external conductor 110 is provided on the inner surface of the cylindrical portion of the connector body 102 and is connected to the external terminal 106. The external conductor 110 is aground terminal that is maintained at a ground potential.

The connector 100b having the structure described above is, as illustrated in FIGS. 6 and 7, mounted on the top surface of the connecting portion 12c such that the external terminal 104 is connected to the external terminal 16b and such that the external terminal 106 is connected to the terminal conductor 22c. As a result, the signal lines 20 and 21 are electrically connected to the central conductor 108, and the main ground conductor 22 and the auxiliary ground conductor 24 are electrically connected to the external conductor 110.

Figure 8:
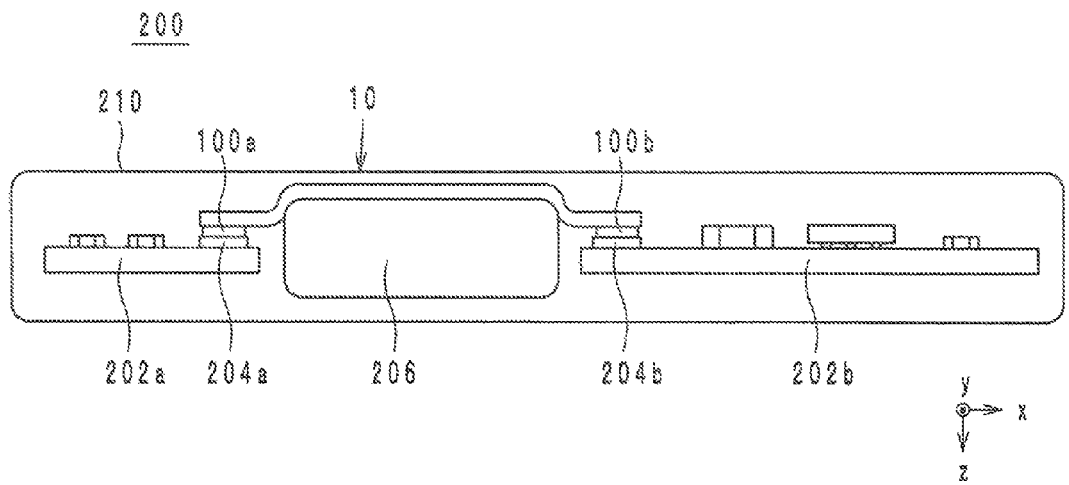
FIG. 8 is a plan view from a y-direction of an electronic device including the high-frequency signal line.
Figure 9:
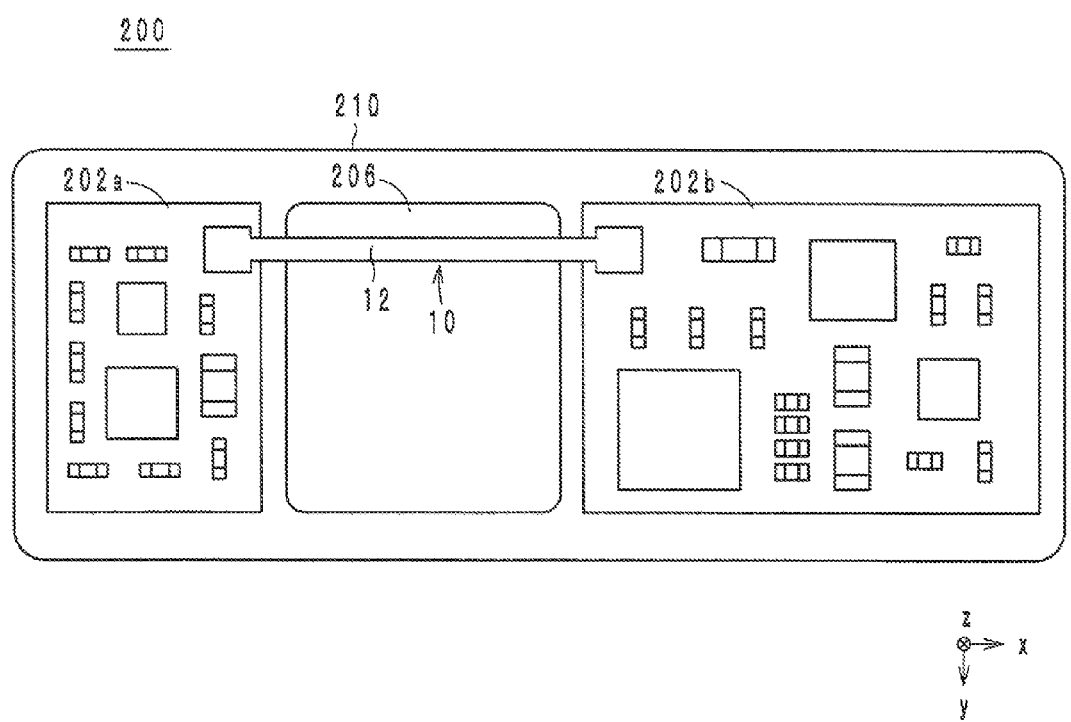
FIG. 9 is a plan view from a z-direction of the electronic device including the high-frequency signal line.

The high-frequency signal line 10 preferably is used in the following way. FIG. 8 is a plan view from the y-direction of an electronic device 200 including the high-frequency signal line 10. FIG. 9 is a plan view from the z-direction of the electronic device 200 including the high-frequency signal line 10.

The electronic device 200 preferably includes the high-frequency signal line 10, circuit boards 202a and 202b, receptacles 204a and 204b, a battery pack (metal object) 206, and a case 210.

In the circuit board 202a, for example, a transmitting circuit or a receiving circuit including an antenna is provided. In the circuit board 202b, for example, a feed circuit is provided. The battery pack 206 is, for example, a lithium-ion secondary battery, and the surface of the battery pack 206 is covered by a metal cover. The circuit board 202a, the battery pack 206 and the circuit board 202b are arranged in this order from the negative side to the positive side in the x-direction.

The receptacles 204a and 204b are provided on respective main surfaces of the circuit boards 202a and 202b on the negative side in the z-direction. The connectors 100a and 100b are connected to the receptacles 204a and 204b respectively. As a result, a high-frequency signal with a frequency of, for example, 2 GHz to be transmitted between the circuit boards 202a and 202b is applied to the central conductors 108 of the connectors 100a and 100b through the receptacles 204a and 204b. The respective external conductors 110 of the connectors 100a and 100b are maintained at the ground potential through the circuit boards 202a and 202b, and the receptacles 204a and 204b. In this way, the high-frequency signal line 10 connects the circuit boards 202a and 202b to each other.

In this state, the top surface of the dielectric body 12 (more specifically, the protective layer 14) is in contact with the battery 206, and the dielectric body 12 is fixed to the battery pack 206 preferably by an adhesive.

With reference to the drawings, a manufacturing method of the high-frequency signal line 10 is described below. In the following, a manufacturing method of one high-frequency signal line 10 is described as an example. Practically, however, by laminating large-size dielectric sheets and by cutting the laminate, a plurality of high-frequency signal lines are produced at one time.

First, dielectric sheets, each preferably formed of thermoplastic resin and having a copper foil (metal film) entirely on one main surface, are prepared as the dielectric sheets 18a and 18c. Specifically, copper foils are applied to respective one main surface of the dielectric sheets 18a and 18c. The surfaces of the copper foils are, for example, galvanized for corrosion proof and thus are smoothened. Each of the dielectric sheets 18a and 18c is lined with copper and obtains a non-fixation surface (shiny surface) with a small surface roughness and a fixation surface (mat surface) with a great surface roughness. The dielectric sheets 18a through 18c are preferably formed of liquid polymer. The thicknesses of the copper foils are preferably within a range from about 10 μm to about 20 μm, for example.

Also, a dielectric sheet preferably formed of thermoplastic resin and having copper foils (metal films) provided entirely on both main surfaces is prepared as the dielectric sheet 18b. Specifically, copper foils are applied to the both main surfaces of the dielectric sheet 18b. The surfaces of the copper foils are, for example, galvanized for corrosion proof and thus are smoothened. The dielectric sheet 18b is preferably formed of liquid polymer. The thicknesses of the copper foils are preferably within a range from about 10 μm to about 20 μm, for example.

Next, the external terminals 16a and 16b, and the main ground conductor 22 as illustrated in FIG. 2 are preferably formed on the upper surface of the dielectric sheet 18a preferably by patterning the copper foil formed on the upper surface of the dielectric sheet 18a. Specifically, resists having identical shapes to the external terminals 16a and 16b, and the main ground conductor 22 are printed on the copper foil on the upper surface of the dielectric sheet 18a. Then, the copper foil is etched, so that the portions of the copper foil not covered by the resists are removed. Thereafter, a resist remover is sprayed so as to remove the resists. In this way, the external terminals 16a and 16b, and the main ground conductor 22 as illustrated in FIG. 2 are preferably formed on the upper surface of the dielectric sheet 18a by photolithography, for example.

Next, the signal line 20 as illustrated in FIG. 2 is formed on the upper surface of the dielectric sheet 18b, and the signal line 21 is formed on the lower surface of the dielectric sheet 18b. Further, the auxiliary ground conductor 24 as illustrated in FIG. 2 is formed on the lower surface of the dielectric sheet 18c. The process for forming the signal line 20, the process for forming the signal line 21 and the process for forming the auxiliary ground conductor 24 are the same as the process for forming the external terminals 16a and 16b, and the main ground conductor 22, and descriptions of the processes are omitted here.

Next, the dielectric sheets 18a through 18c are exposed to laser beams such that through holes are made in the dielectric sheets 18a through 18c at the positions of the via-hole conductors b1 through b4 and B1 through B6. Thereafter, conductive paste is filled in the through holes, and thus, the via-hole conductors b1 through b4 and B1 through B6 are formed.

Next, the dielectric sheets 18a through 18c are laminated in this order from the positive side to the negative side in the z-direction so as to form the dielectric body 12. In this regard, heat and pressure are applied to the dielectric sheets 18a through 18c from the both sides in the z-direction, and thus, the dielectric sheets 18a through 18c are pressure-bonded together.

Next, resin (resist) paste is applied to the upper surface of the dielectric sheet 18a as illustrated in FIG. 2 by screen printing. Thus, the protective layer 14 covering the upper surface of the main ground conductor 22 is formed on the upper surface of the dielectric sheet 18a.

Next, resin (resist) paste is applied to the lower surface of the dielectric sheet 18c as illustrated in FIG. 2 by screen printing. Thus, the protective layer 15 covering the lower surface of the auxiliary ground conductor 24 is formed on the lower surface of the dielectric sheet 18c.

Lastly, the connector 100a is mounted on the connecting portion 12b and soldered to the external terminal 16a and the terminal conductor 22b, and the connector 100b is mounted on the connecting portion 12c and soldered to the external terminal 16b and the terminal conductor 22c. Through the process above, the high-frequency signal line 10 as illustrated in FIG. 1 is obtained.

In the high-frequency signal line 10 having the structure described above, the insertion loss is significantly reduced. More specifically, in the high-frequency signal line 10, the signal line 20 is provided on the upper surface of the dielectric sheet 18b, and the signal line 21 is provided on the lower surface of the dielectric sheet 18b. The signal lines 20 and 21 face each other and are electrically connected to each other. Accordingly, the signal lines 20 and 21 constitute one signal transmission route. The thickness of the signal transmission route including the signal lines 20 and 21 is the total of the thickness of the signal line and the thickness of the signal line 21. Thus, the cross-sectional area of the signal transmission route is increased because the signal transmission route includes the signal lines 20 and 21. Consequently, the insertion loss of the high-frequency signal line 10 is significantly reduced.

In the high-frequency signal line 10, there is another reason as follows for the reduction in the insertion loss. Specifically, when a high-frequency signal flows in the signal line 20, a current flows intensively in the superficial portion of the signal line 20 by the skin effect. With respect to the signal line 20, the current flows intensively especially on and near the surface facing the main ground conductor 22 (that is, the surface out of contact with the dielectric sheet 18b). More specifically, in the high-frequency signal line 10, the surface roughness of the surface of the signal line 20 out of contact with the dielectric sheet 18b is smaller than that of the surface of the signal line in contact with the dielectric sheet 18b. Therefore, the proportion of conductive material in an area from the surface of the signal line 20 out of contact with the dielectric sheet 18b to a position at a specified depth (an area where the current flows intensively) is higher than the proportion of conductive material in an area from the surface of the signal line 20 in contact with the dielectric sheet 18b to the position at the specified depth. Accordingly, the portion of the signal line 20 near the surface out of contact with the dielectric sheet 18b is easier to pass a current than the portion of the signal line 20 near the surface in contact with the dielectric sheet 18b. Consequently, in the high-frequency signal line 10, the insertion loss is significantly reduced. Further, the same phenomenon occurs on the signal line 21.

In the high-frequency signal line 10, damage to the dielectric sheets 18a and 18b is prevented. Specifically, the signal transmission route includes the signal lines 20 and 21. The signal line 20 is preferably formed by etching a conductive layer having a thickness equal or substantially equal to the thickness of the signal line 20. In the same way, the signal line 21 is preferably formed by etching a conductive layer having a thickness equal or substantially equal to the thickness of the signal line 21. Accordingly, in order to form a signal transmission route of the signal lines 20 and 21, it is not necessary to etch a conductive layer having a thickness equal or substantially equal to the total of the thickness of the signal line 20 and the thickness of the signal line 21, and it is not necessary to use a more acid etching solution. Thus, the risk that the dielectric sheets 18a and 18c are damaged during a process of forming a signal transmission route of the signal lines 20 and 21 is diminished.

Also, the high-frequency signal line 10 is easy to bend. Specifically, when the high-frequency signal line 10 is bent, for example, the signal line 20 located in the outer periphery stretches, and the signal line 21 located in the inner periphery compresses. Accordingly, the signal lines 20 and 21 come out of alignment with each other. More specifically, the flexible dielectric sheet 18b is provided between the signal lines 20 and 21. Thus, when the signal line 20 stretches and the signal line compresses, the flexible dielectric sheet 18b deforms. Accordingly, when the high-frequency signal line 10 is bent, the signal lines 20 and 21 readily come out of alignment with each other. Thus, the high-frequency signal line 10 is easy to bend.

Further, it is possible to make the high-frequency signal line 10 thinner. More specifically, when the high-frequency signal line 10 is viewed from the z-direction, in the areas A1, the signal lines 20 and 21 are not over the auxiliary ground conductor 24. Accordingly, little capacitance is created between the signal lines 20 and 21, and the auxiliary ground conductor 24. Therefore, even a reduction in the distance between the signal lines 20 and 21, and the auxiliary ground conductor 24 will not cause a significant increase in the capacitance between the signal lines 20 and 21, and the auxiliary ground conductor 24 and will not result in a significant shift of the characteristic impedance of the signal lines 20 and 21 from a designed value (for example, about 50Ω). Thus, it is possible to make the high-frequency signal line 10 thinner while maintaining the characteristic impedance of the signal lines 20 and 21 at a designed value.

Even when the high-frequency signal line 10 is fixed to a metal object such as the battery pack 206, a change in the characteristic impedance of the signal lines 20 and 21 is prevented. More specifically, the high-frequency signal line 10 is fixed to the battery pack 206 such that the continuous main ground conductor 22 is located between the signal lines 20 and 21, and the battery pack 206. Therefore, there is no risk that the signal lines 20 and 21 face the battery pack 206 via openings, and capacitance is prevented from occurring between the signal lines 20 and 21, and the battery pack 206. Accordingly, it is unlikely that the characteristic impedance of the signal lines 20 and 21 is reduced due to the fixation of the high-frequency signal line 10 to the battery pack 206.

First Modification

Figure 10:
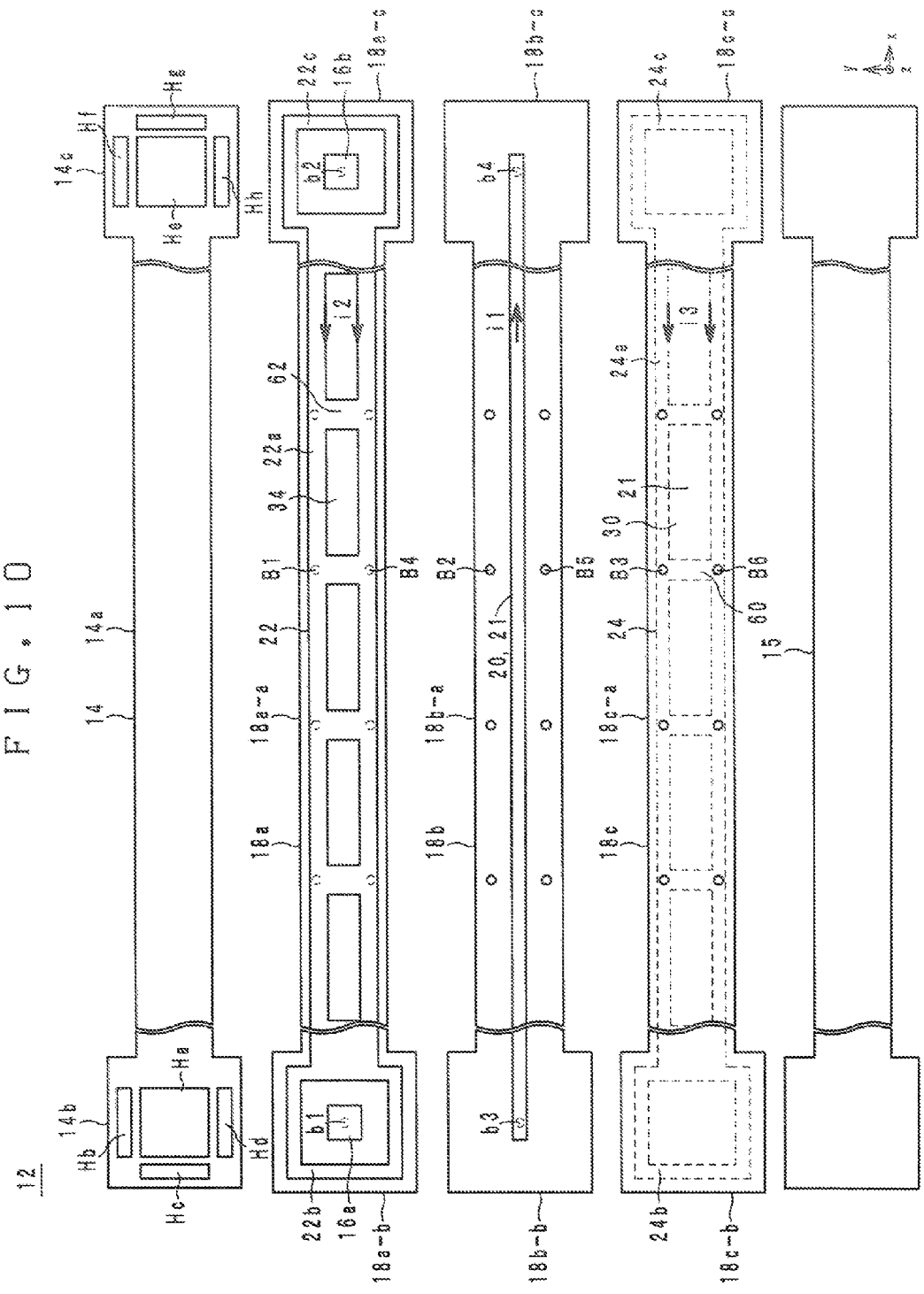
FIG. 10 is an exploded view of a dielectric body of a high-frequency signal line according to a first modification of a preferred embodiment of the present invention.

The structure of a high-frequency signal line 10a according to a first modification of a preferred embodiment of the present invention is described with reference to the drawings. FIG. 10 is an exploded view of the dielectric body 12 of the high-frequency signal line 10a according to the first modification. The appearance of the high-frequency signal line 10a is as illustrated in FIG. 1.

The high-frequency signal line 10a is different from the high-frequency signal line 10 in that the main ground conductor 22 includes openings 34.

As seen in FIG. 10, the line portion 22a of the main ground conductor 22 includes rectangular or substantially rectangular openings 34 aligned in the x-direction. Accordingly, the line portion 24a is shaped like a ladder. In the main ground conductor 22, intervals between the openings 34 are referred to as bridges 62. Each of the bridges 62 extends in the y-direction. When viewed from the z-direction, the openings 34 and the bridges 62 are alternately arranged to be overlapped with the signal line 20. In this preferred embodiment, the signal line 20 extends in the x-direction while crossing the centers of the openings 34 and the bridges 62.

The openings 34 are smaller than the openings 30. Specifically, the length (size in the x-direction) of each of the openings 34 is smaller than the length (size in the x-direction) of each of the openings 30. The width (size in the y-direction) of each of the openings 34 is smaller than the width (size in the y-direction) of the each of the openings 30. When viewed from the z-direction, the outer edges of the openings 30 do not overlap the outer edges of the openings 34. When viewed from the z-direction, the openings 34 are inside the respective outer edges of the openings 30.

In the high-frequency signal line 10a having the structure described above, the insertion loss is significantly reduced for the same reason described above in connection with the high-frequency signal line 10.

In the high-frequency signal line 10a, damage to the dielectric sheets 18a and 18b is prevented for the same reason described above in connection with the high-frequency signal line 10.

The high-frequency signal line 10a is easy to bend for the same reason described above in connection with the high-frequency signal line 10.

It is possible to make the high-frequency signal line 10a thinner for the same reason described above in connection with the high-frequency signal line 10.

Moreover, it is possible to further reduce the insertion loss of the high-frequency signal line 10a for the following reason. In the high-frequency signal line 10a, when a current i1 flows in the signal lines 20 and 21, a countercurrent i2 flows in the main ground conductor 22, and a countercurrent i3 flows in the auxiliary ground conductor 24. The countercurrents i2 and i3 flow along the outer edges of the openings 30 and 34 by skin effect. In the high-frequency signal line 10a, the outer edges of the openings 30 do not overlap the outer edges of the openings 34. Accordingly, the flow path of the countercurrent i2 is spaced from the flow path of the countercurrent i3, and coupling between the countercurrent i2 and the countercurrent i3 is weak. Therefore, the current i1 flows easily. Thus, the insertion loss of the high-frequency signal line 10a is further reduced.

Second Modification

Figure 11:
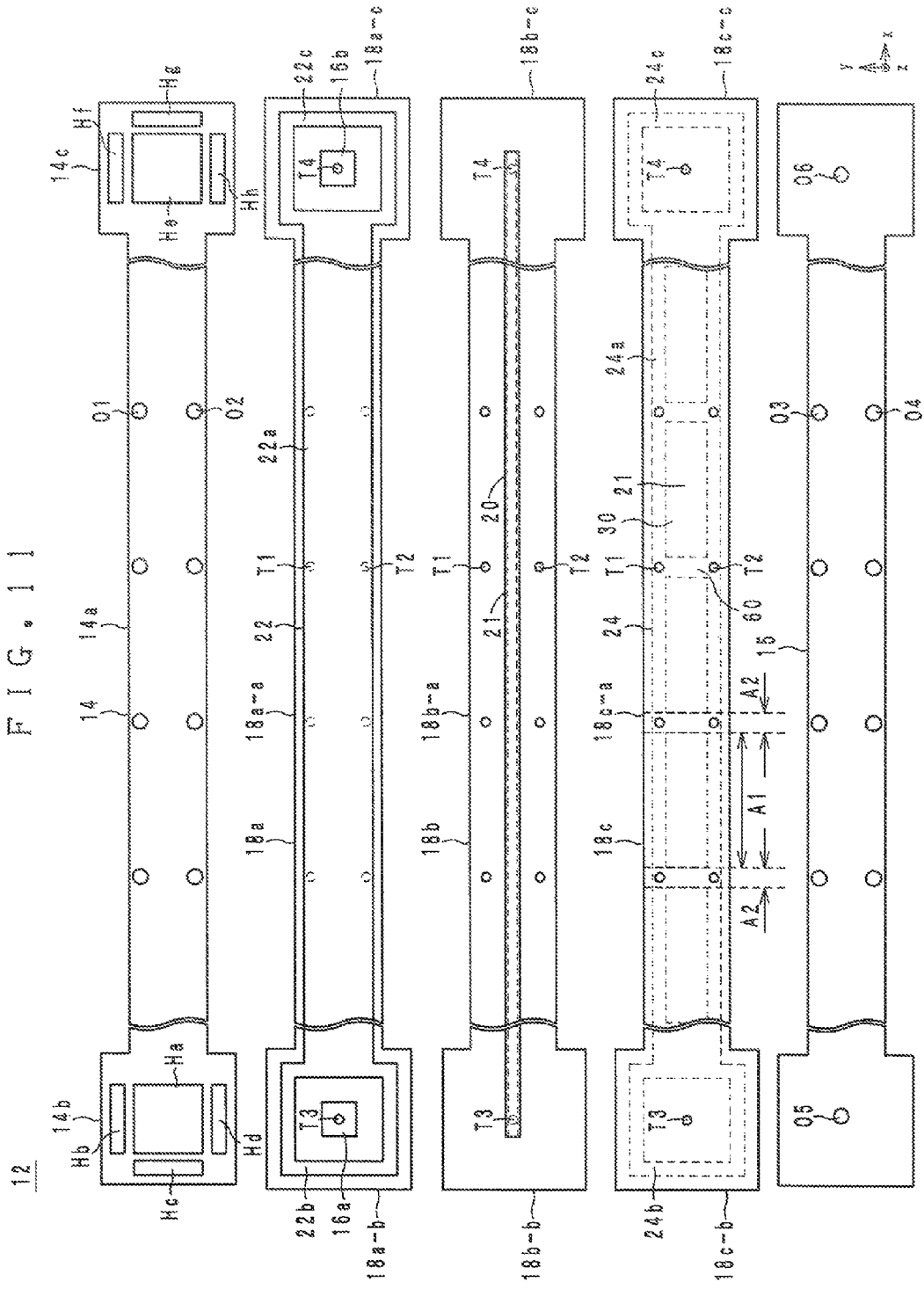
FIG. 11 is an exploded view of a dielectric body of a high-frequency signal line according to a second modification of a preferred embodiment of the present invention.
Figure 12:
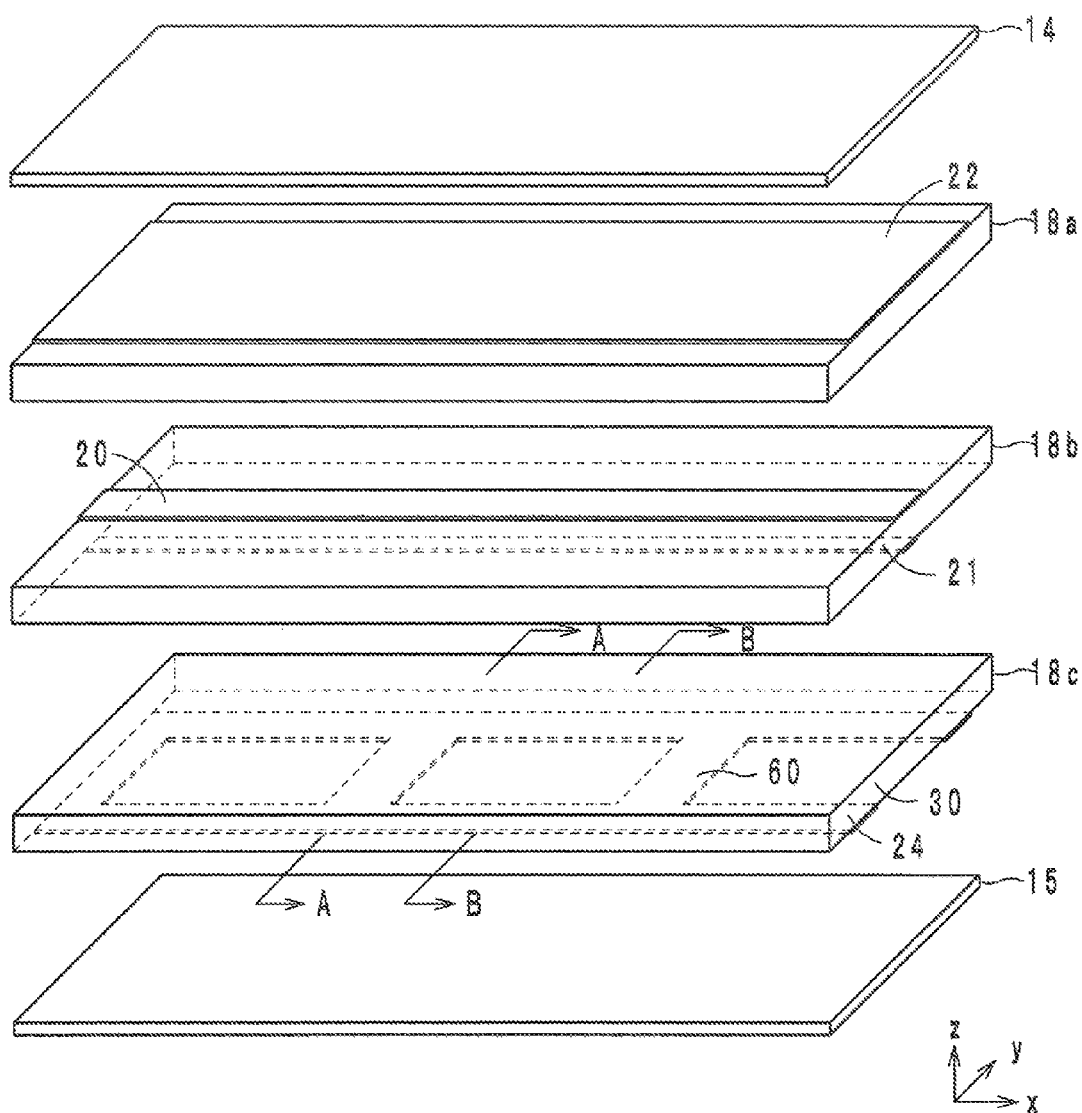
FIG. 12 is an exploded perspective view of a line portion of the high-frequency signal line.
Figure 13:
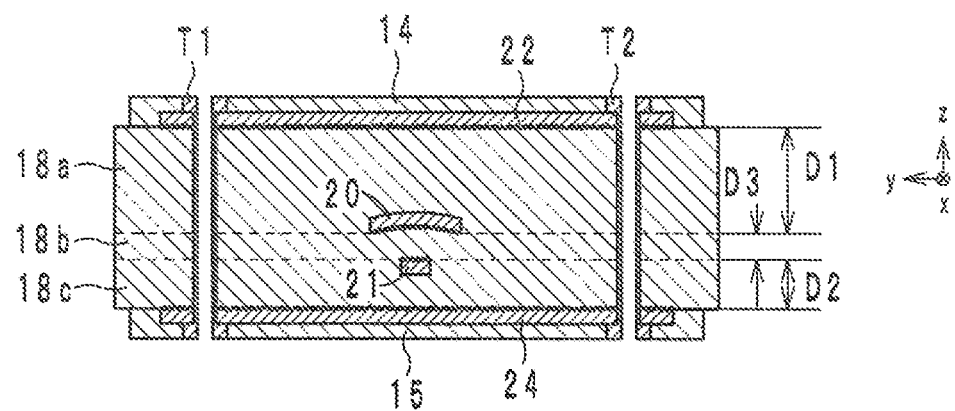
FIG. 13 is a sectional view of the high-frequency signal line along the line A-A indicated in FIG. 12.
Figure 14:
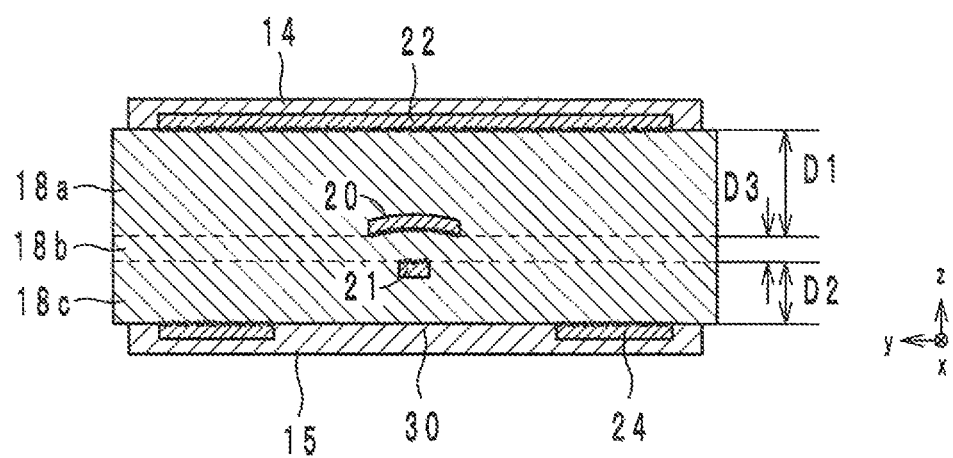
FIG. 14 is a sectional view of the high-frequency signal line along the line B-B indicated in FIG. 12.

The structure of a high-frequency signal line 10b according to a second modification of a preferred embodiment of the present invention is described with reference to the drawings. FIG. 11 is an exploded view of the dielectric body 12 of the high-frequency signal line 10b according to the second modification. FIG. 12 is an exploded perspective view of the line portion 12a of the high-frequency signal line 10b. FIG. 13 is a sectional view of the high-frequency signal line 10b along the line A-A indicated in FIG. 12. FIG. 14 is a sectional view of the high-frequency signal line 10b along the line B-B indicated in FIG. 12. The appearance of the high-frequency signal line 10b is as illustrated in FIG. 1.

The high-frequency signal line 10b is different from the high-frequency signal line 10 in that the line width of the signal line 20 is different from the line width of the signal line 21 and that through-hole conductors T1 through T4 are used. Specifically, as seen in FIGS. 11 and 12, the line width of the signal line 20 is greater than the line width of the signal line 21. When viewed from the z-direction, the signal line 21 is located inside the signal line 20. The signal line 21 does not need to be located completely inside the signal line 20 when viewed from the z-direction. However, in order to permit the signal lines 20 and 21 to function substantially as one signal line, it is preferred that the signal line 21 is located substantially inside the signal line 20 when viewed from the z-direction.

During a laminate/pressure-bonding process for forming the dielectric body 12 of the high-frequency signal line 10b, the signal line 20 deforms. More specifically, as seen in FIGS. 13 and 14, the signal line 20 curves so as to protrude in the positive z-direction.

The through-hole conductors T1 are, as seen in FIG. 11, pierced in the dielectric sheets 18a through 18c in the z-direction. The through-hole conductors T1 are located farther in the positive y-direction than the signal lines 20 and 21, and are aligned in the x-direction at uniform intervals. The respective positive ends in the z-direction of the through-hole conductors T1 are connected to the main ground conductor 22. The respective negative ends in the z-direction of the through-hole conductors T1 are connected to the auxiliary ground conductor 24. Accordingly, the through-hole conductors T1 connect the main ground conductor 22 and the auxiliary ground conductor 24 to each other. The through-hole conductors T1 are preferably formed by piercing through holes in the dielectric sheets 18a through 18c and by forming metal films including nickel, gold or the like on inner peripheral surfaces of the through holes by plating.

The through-hole conductors T2 are, as seen in FIG. 11, pierced in the dielectric sheets 18a through 18c in the z-direction. The through-hole conductors T2 are located farther in the negative y-direction than the signal lines 20 and 21, and are aligned in the x-direction at uniform or substantially uniform intervals. The respective positive ends in the z-direction of the through-hole conductors T2 are connected to the main ground conductor 22. The respective negative ends in the z-direction of the through-hole conductors T2 are connected to the auxiliary ground conductor 24. Accordingly, the through-hole conductors T2 connect the main ground conductor 22 and the auxiliary ground conductor 24 to each other. The through-hole conductors T2 are preferably formed by piercing through holes in the dielectric sheets 18a through 18c and by forming metal films including nickel, gold or the like on inner peripheral surfaces of the through holes by plating.

The through-hole conductor T3, as seen in FIG. 11, is pierced in the dielectric sheets 18a through 18c in the z-direction so as to connect the external terminal 16a to the negative end in the x-direction of the signal line 20 and farther to the negative end in the y-direction of the signal line 21. The through-hole conductor T4, as seen in FIG. 11, is pierced in the dielectric sheets 18a through 18c in the z-direction so as to connect the external terminal 16b to the positive end in the x-direction of the signal line 20a and farther to the positive end in the x-direction of the signal line 21. Accordingly, the signal lines 20 and 21 are connected between the external terminals 16a and 16b, and the signal line 20 and the signal line 21 are electrically connected to each other. The through-hole conductors T3 and T4 are preferably formed by piercing through holes in the dielectric sheets 18a through 18c and by forming metal films including nickel, gold or the like on inner peripheral surfaces of the through holes by plating.

The protective layer 14 has openings O1 and O2 at positions over the through-hole conductors T1 and T2. The protective layer 15 includes openings O3 through O6 at positions underneath the through-hole conductors T1 through T4.

In the high-frequency signal line 10b having the structure described above, the insertion loss is significantly reduced for the same reason described above in connection with the high-frequency signal line 10.

In the high-frequency signal line 10b, damage to the dielectric sheets 18a and 18b is prevented for the same reason described above in connection with the high-frequency signal line 10.

The high-frequency signal line 10b is easy to bend for the same reason described above in connection with the high-frequency signal line 10.

It is possible to make the high-frequency signal line 10b thinner for the same reason described above in connection with the high-frequency signal line 10.

Even when the high-frequency signal line 10b is fixed to a metal object such as the battery pack 206, a change in the characteristic impedance of the signal lines 20 and 21 is prevented for the same reason described above in connection with the high-frequency signal line 10.

In the high-frequency signal line 10b, there is another reason as follows for the reduction in the insertion loss. When a current flows in the signal line 20, lines of electric force occur intensively from the both side portions in the y-direction of the signal line 20 to the main ground conductor 22 by edge effect. The intensive occurrence of lines of electric force from the both side portions in the y-direction of the signal line 20 causes an intensive current flow in the both side portions in the y-direction of the signal line 20. Accordingly, the current passes in a small area of the signal line 20, and thus, the signal line 20 is hard to pass a current.

In order to avoid this trouble, in the high-frequency signal line 10b, the signal line 20 curves such that the central portion with respect to the y-direction protrudes in the positive z-direction. Thus, the both side portions in the y-direction of the signal line 20 are more distant from the main ground conductor 22 than the central portion of the signal line 20 with respect to the y-direction. Therefore, the intensive occurrence of lines of electric force from the both side portions in the y-direction of the signal line 20 is prevented. Consequently, the current passes in the whole area of the signal line 20, and the signal line 20 becomes easy to pass a current. Thus, in the high-frequency signal line 10b, the insertion loss is significantly reduced.

Figure 16:
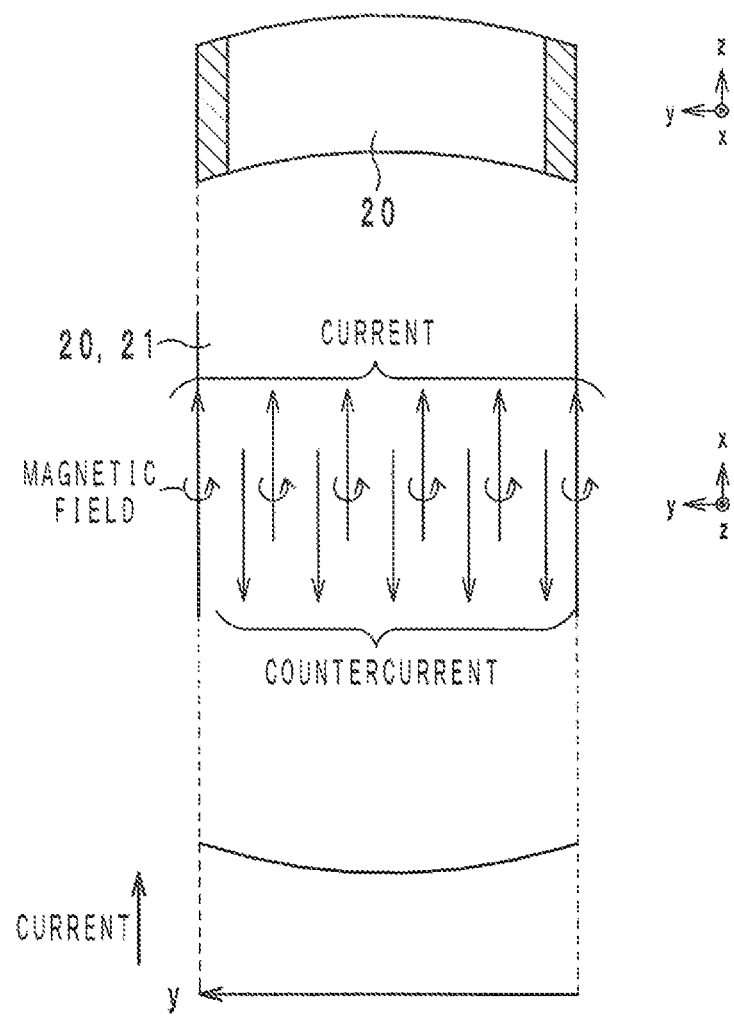
FIG. 16 indicates a sectional view and a plan view of a curved signal line and a chart indicating current distribution.

In the high-frequency signal line 10b, there is still another reason as follows for the reduction in the insertion loss. FIG. 15 indicates a sectional view and a plan view of a non-curved signal line 20, and a chart indicating current distribution. FIG. 16 indicates a sectional view and a plan view of a curved signal line 20, and a chart indicating current distribution.

As illustrated in FIGS. 15 and 16, when a current flows in the signal line 20, a magnetic field is generated so as to go around the current. Then, due to electromagnetic induction, a countercurrent flowing in a direction opposite to the current is generated. In the central portion of the signal line 20 with respect to the y-direction, the countercurrent flows on the both sides in the y-direction of the current. In the positive side portion in the y-direction of the signal line 20, however, the countercurrent flows only on the negative side in the y-direction of the current. Similarly, in the negative side portion in the y-direction of the signal line 20, the countercurrent flows only on the positive side in the y-direction of the current. Therefore, in the signal line 20, the current value in the central portion of the signal line 20 with respect to the y-direction is lower than the current value in the both side portions of the signal line 20 in the y-direction.

The width (size in the y-direction) of the signal line 20 illustrated in FIG. 16 is smaller than the width (size in the y-direction) of the signal line illustrated in FIG. 15. Therefore, when the total current flowing in the signal line 20 illustrated in FIG. 15 is equal to the total current flowing in the signal line 20 illustrated in FIG. 16, the current flowing in the central portion, with respect to the y-direction, of the signal line 20 illustrated in FIG. 16 is greater than the current flowing in the central portion, with respect to the y-direction, of the signal line 20 illustrated in FIG. 15. Accordingly, a current flows in the entire signal line 20 illustrated in FIG. 16, and the signal line 20 illustrated in FIG. 16 as a whole is easy to pass a current. Thus, in the high-frequency signal line 10b, the insertion loss is reduced. In sum, an edge effect is seen in the side portions of the signal line 20. The edge effect hardly appears on the curved and narrow signal line 20, and the curved signal line 20 has a smaller insertion loss.

Third Modification

Figure 17:
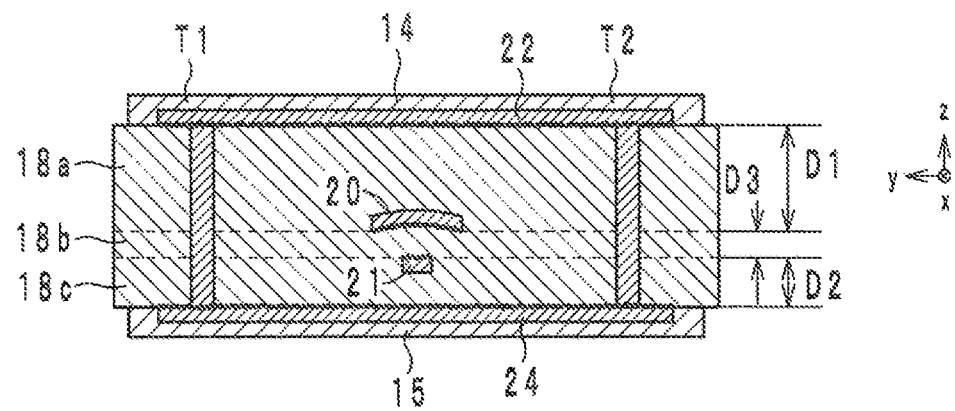
FIG. 17 is a sectional view of a high-frequency signal line according to a third modification of a preferred embodiment of the present invention cut at an opening.

The structure of a high-frequency signal line 10c according to a third modification of a preferred embodiment of the present invention is described with reference to the accompanying drawings. FIG. 17 is a sectional view of the high-frequency signal line 10c according to the third modification cut at an opening 30. The appearance of the high-frequency signal line 10c is as illustrated in FIG. 1.

The high-frequency signal line 10c is different from the high-frequency signal line 10b in that via-hole conductors b1 through b4 and B1 through B6 are used instead of the through hole conductors T1 through T4.

In the high-frequency signal line 10c having the structure described above, the insertion loss is significantly reduced for the same reason as described above in connection with the high-frequency signal line 10b.

In the high-frequency signal line 10c, damage to the dielectric sheets 18a and 18b are prevented for the same reason described above in connection with the high-frequency signal line 10b.

The high-frequency signal line 10c is easy to bend for the same reason described above in connection with the high-frequency signal line 10b.

It is possible to make the high-frequency signal line 10c thinner for the same reason described above in connection with the high-frequency signal line 10b.

Even when the high-frequency signal line 10c is fixed to a metal object such as the battery pack 206, a change in the characteristic impedance of the signal lines 20 and 21 is prevented for the same reason described above in connection with the high-frequency signal line 10b.

Fourth Modification

Figure 18:
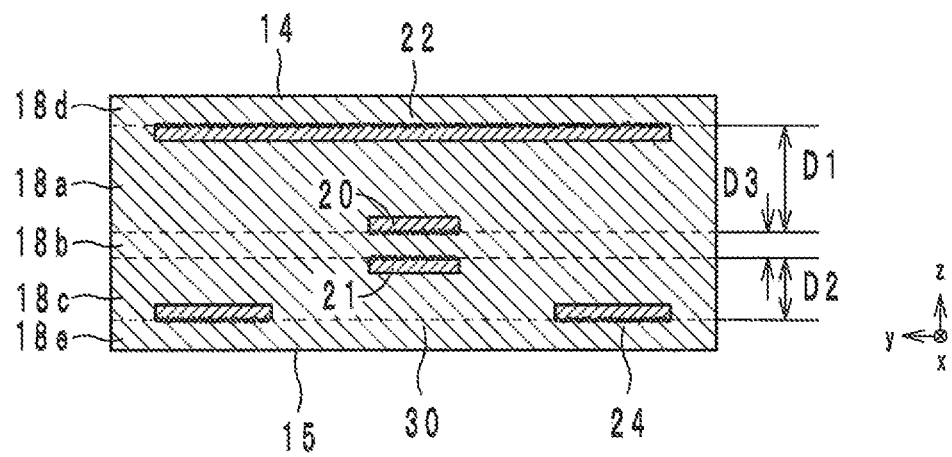
FIG. 18 is a sectional view of a dielectric body of a high-frequency signal line according to a fourth modification of a preferred embodiment of the present invention.

The structure of a high-frequency signal line 10d according to a fourth modification of a preferred embodiment of the present invention is described with reference to the drawings. FIG. 18 is a sectional view of the high-frequency signal line 10d according to the fourth modification. The appearance of the high-frequency signal line 10d is as illustrated in FIG. 1.

The high-frequency signal line 10d is different from the high-frequency signal line 10 in the positions of the main ground conductor 22 and the auxiliary ground conductor 24. More specifically, in the high-frequency signal line 10d, a dielectric sheet 18d is placed on the positive side in the z-direction of the dielectric sheet 18a, and a dielectric sheet 18e is placed on the negative side in the z-direction of the dielectric sheet 18c.

The main ground conductor 22 is provided on the lower surface of the dielectric sheet 18d. The surface of the main ground conductor 22 in contact with the dielectric sheet 18d has a greater surface roughness than the surface of the main ground conductor 22 out of contact with the dielectric sheet 18d.

The auxiliary ground conductor 24 is provided on the upper surface of the dielectric sheet 18e. The surface of the auxiliary ground conductor 24 in contact with the dielectric sheet 18e has a greater surface roughness than the surface of the auxiliary ground conductor 24 out of contact with the dielectric sheet 18e.

In the high-frequency signal line 10d having the structure described above, the insertion loss is significantly reduced for the same reason as described above in connection with the high-frequency signal line 10.

In the high-frequency signal line 10d, damage to the dielectric sheets 18a and 18b is prevented for the same reason described above in connection with the high-frequency signal line 10.

The high-frequency signal line 10d is easy to bend for the same reason described above in connection with the high-frequency signal line 10.

It is possible to make the high-frequency signal line 10d thinner for the same reason described above in connection with the high-frequency signal line 10.

Even when the high-frequency signal line 10d is fixed to a metal object such as the battery pack 206, a change in the characteristic impedance of the signal lines 20 and 21 is prevented for the same reason described above in connection with the high-frequency signal line 10.

In the high-frequency signal line 10d, there is another reason as follows for the reduction in the insertion loss. Specifically, when a high-frequency signal flows in the signal line 20, a current flows intensively in the superficial portion of the signal line 20 by the skin effect. With respect to the signal line 20, the current flows intensively especially near the surface facing the main ground conductor 22 (that is, the surface out of contact with the dielectric sheet 18b). Then, on the surface of the main ground conductor 22 facing the signal line 20 (that is, the surface of the main ground conductor 22 out of contact with the dielectric sheet 18d), a countercurrent flows. More specifically, in the high-frequency signal line 10d, the surface roughness of the surface of the main ground conductor 22 out of contact with the dielectric sheet 18d is smaller than that of the surface of the main ground conductor 22 in contact with the dielectric sheet 18d. Therefore, the proportion of conductive material in an area from the surface of the main ground conductor 22 out of contact with the dielectric sheet 18d to a position at a specified depth is higher than the proportion of conductive material in an area from the surface of the main ground conductor 22 in contact with the dielectric sheet 18d to the position at the specified depth. Accordingly, the portion of the main ground conductor 22 near the surface out of contact with the dielectric sheet 18d is easier to pass a current than the portion of the main ground conductor 22 near the surface in contact with the dielectric sheet 18d. Consequently, in the high-frequency signal line 10d, the insertion loss is significantly reduced. The same phenomenon occurs on the auxiliary ground conductor 24.

Other Preferred Embodiments

High-frequency signal lines according to the present invention are not limited to the high-frequency signal lines 10 and 10a through 10d, and various changes are possible within the scope of the present invention.

It is possible to combine the structures of the high-frequency signal lines 10 and 10a through 10d.

In the high-frequency signal lines 10 and 10a through 10d described above, the protective layers 14 and 15 are preferably formed by screen printing, for example. However, the protective layers 14 and 15 may be preferably formed by photolithography, for example.

The connectors 100a and 100b are not indispensable for the high-frequency signal lines 10 and 10a through 10d. In a case where the connectors 100a and 100b are not provided, the both ends of each of the high-frequency signal lines 10 and 10a through 10d are connected to circuit boards by solder or the like. It is also possible that only the connector 100a is provided at only one end of each of the high-frequency signal lines 10 and 10a through 10d.

In the high-frequency signal lines 10 and 10a through 10d, the connectors 100a and 100b are mounted on the top surface. However, the connectors 100a and 100b may be mounted on the bottom surface. Also, the connector 100a may be mounted on the top surface of each of the high-frequency signal lines 10 and 10a through 10d, and the connector 100b may be mounted on the bottom surface of each of the high-frequency signal lines 10 and 10a through 10d.

Either one of the main ground conductor 22 and the auxiliary ground conductor 24 may be omitted from the high-frequency signal lines 10 and 10a through 10d.

The auxiliary ground conductor 24 does not need to have openings.

Each of the high-frequency signal lines 10 and 10a through 10d may be used as a high-frequency signal line in an RF circuit board such as an antenna front-end module.

As thus far described, various preferred embodiments of the present invention and modifications thereof is useful in a high-frequency signal line, and preferred embodiments of the present invention and modifications thereof has the advantage of preventing damage to dielectric layers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal line comprising:
   a dielectric body including a first dielectric layer and one or more other dielectric layers laminated together in a lamination direction;
   a first signal line provided on a first main surface of the first dielectric layer, the first main surface being a main surface of the first dielectric layer located on one side of the first dielectric layer in the lamination direction;
   a second signal line provided on a second main surface of the first dielectric layer to face the first signal line with the first dielectric layer disposed therebetween, the second main surface being another main surface of the first dielectric layer located on another side of the first dielectric layer in the lamination direction, and the second signal line being electrically connected to the first signal line;
   a first ground conductor located on the one side of the first dielectric layer in the lamination direction farther from the first main surface than the first signal line; and
   a second ground conductor located on the another side of the first dielectric layer in the lamination direction farther from the second main surface than the second signal line; wherein
   a line width of the first signal line is greater than a line width of the second signal line; and
   the first signal line is curved so as to protrude on one side in the lamination direction.

2. The high-frequency signal line according to claim 1, wherein
   a surface of the first signal line in contact with the first dielectric layer has a greater surface roughness than a surface of the first signal line out of contact with the first dielectric layer; and
   a surface of the second signal line in contact with the first dielectric layer has a greater surface roughness than a surface of the second signal line out of contact with the first dielectric layer.

3. The high-frequency signal line according to claim 1, wherein
   the second ground conductor includes openings aligned along the second signal line; and
   a distance in the lamination direction between the first signal line and the first ground conductor is greater than a distance in the lamination direction between the second signal line and the second ground conductor.

4. The high-frequency signal line according to claim 1, wherein the dielectric body is flexible.

* * * * *